United States Patent
De Keyzer et al.

(10) Patent No.: US 8,993,202 B2
(45) Date of Patent: Mar. 31, 2015

(54) COLOR FILTER FOR LOW TEMPERATURE APPLICATIONS

(75) Inventors: Gerardus De Keyzer, Riehen (CH); Liliana Craciun, Carmel, NY (US); Michael Kuepfert, Olten (CH); Frank Oliver Heinrich Pirrung, Grunstadt (DE)

(73) Assignee: BASF SE, Ludwigshafen (GB)

(*) Notice: Subject to any disclaimer, the term of this patent is extended or adjusted under 35 U.S.C. 154(b) by 0 days.

(21) Appl. No.: 13/695,805

(22) PCT Filed: May 2, 2011

(86) PCT No.: PCT/EP2011/056976
§ 371 (c)(1),
(2), (4) Date: Nov. 30, 2012

(87) PCT Pub. No.: WO2011/138287
PCT Pub. Date: Nov. 10, 2011

(65) Prior Publication Data
US 2013/0065168 A1   Mar. 14, 2013

Related U.S. Application Data

(60) Provisional application No. 61/330,421, filed on May 3, 2010, provisional application No. 61/330,419, filed on May 3, 2010.

(30) Foreign Application Priority Data

May 3, 2010 (EP) .................................... 10161749
May 3, 2010 (EP) .................................... 10161755

(51) Int. Cl.
*G02B 5/20* (2006.01)
*G03F 7/20* (2006.01)
*G02B 5/23* (2006.01)
*G02F 1/167* (2006.01)
*G03F 7/00* (2006.01)
*G03F 7/027* (2006.01)
*G02F 1/1335* (2006.01)

(52) U.S. Cl.
CPC .. *G02B 5/23* (2013.01); *G02B 5/20* (2013.01); *G02B 5/201* (2013.01); *G02F 1/133514* (2013.01); *G02F 1/133516* (2013.01); *G02F 1/167* (2013.01); *G03F 7/0007* (2013.01); *G03F 7/027* (2013.01); *Y10T 428/10* (2013.01); *Y10T 428/273* (2013.01)
USPC .............................................................. 430/7

(58) Field of Classification Search
None
See application file for complete search history.

(56) References Cited

U.S. PATENT DOCUMENTS

| | | |
|---|---|---|
| 3,448,089 A | 6/1969 | Celeste |
| 4,960,673 A | 10/1990 | Beck |
| 4,985,343 A | 1/1991 | Kushi et al. |
| 5,362,603 A | 11/1994 | Katoh et al. |
| 5,476,752 A | 12/1995 | Noguchi |
| 5,543,266 A | 8/1996 | Noguchi |
| 5,863,678 A | 1/1999 | Urano et al. |
| 2002/0018953 A1 | 2/2002 | Maruyama et al. |
| 2002/0031723 A1 | 3/2002 | Kumazawa et al. |
| 2006/0128853 A1 | 6/2006 | Olson |
| 2010/0164911 A1 | 7/2010 | De Keyzer |
| 2010/0323284 A1 | 12/2010 | Nakashima et al. |

FOREIGN PATENT DOCUMENTS

| | | |
|---|---|---|
| EP | 0465949 A2 | 1/1992 |
| JP | 8184960 A | 7/1996 |
| JP | 2009-265630 | 11/2009 |
| JP | 2010033925 A | 2/2010 |
| JP | 2010113034 A | 5/2010 |
| KR | 20090104670 A | 10/2009 |
| WO | WO 2008/081996 A2 * | 7/2008 |

OTHER PUBLICATIONS

Computer-generated translation of KR 2009-0104670 (Oct. 2009).*
English Language Abst of KR 2009/0104670 Oct. 6, 2009.
English Language Abst of JP2010033925 Feb. 12, 2010.
English Language Abst of JP8184960 Jul. 16, 1996.
English Language Abst of JP2010113034 May 20, 2010.
English Language Abst of EP 0465949 Jan. 15, 1992.

* cited by examiner

*Primary Examiner* — John A. McPherson
(74) *Attorney, Agent, or Firm* — Oblon, McClelland, Maier & Neustadt, L.L.P.

(57) ABSTRACT

A color filter comprising a cured layer of a photosensitive resist composition comprising a highly reactive polyacrylate monomer and an alkali soluble binder having a side chain containing an ethylenically unsaturated bond in the side chain and a process for the preparation thereof are provided. The color filter is especially useful for low temperature applications such as electrophoretic displays, polymer dispersed liquid crystal displays, OLED devices and the like.

14 Claims, No Drawings

COLOR FILTER FOR LOW TEMPERATURE APPLICATIONS

The invention relates to a color filter comprising a substrate and a cured pigment-containing photosensitive resist composition, its manufacturing process and use in devices like electrophoretic displays, polymer dispersed liquid crystal displays and OLED displays.

Electrophoretic display, so-called E-paper, is an emerging technology that allows the text on a piece of paper to be re-written. The "paper" is actually made of organic electronics that use conductive plastic which contains tiny balls that respond to an electric charge, changing the page in much the same way that pixels change on a computer monitor.

E-paper overcomes some of the limitations of computer monitors. For example, the backlighting of monitors is hard on the human eye, whereas E-paper reflects light just like normal paper. It is easier to read at an angle than flat screen monitors. Because it is made of plastic, electronic paper has the potential to be flexible. It is light and potentially inexpensive.

E-paper was first developed in the 1970s by Nick Sheridon at Xerox's Palo Alto Research Center. The first E-paper, called Gyricon, consisted of tiny, statically charged balls that were black on one side and white on the other. The "text" of the paper was altered by the presence of an electric field, which turned the balls up or down.

In the 1990s another type of E-paper was invented by Joseph Jacobson. This used tiny microcapsules filled with electrically charged white particles suspended in a colored oil. In early versions, the underlying circuitry controls whether the white particles were at the top of the capsule (so it looked white to the viewer) or at the bottom of the capsule (so the viewer saw the color of the oil). This was essentially a reintroduction of the well-known electrophoretic display technology, but the use of microcapsules allowed the display to be used on flexible plastic sheets instead of glass. There are many approaches to E-paper, with many companies developing technology in this area. Other technologies being applied to electronic paper include modifications of liquid crystal displays, electrochromic displays, and the electronic equivalent of an Etch-A-Sketch at Kyushu University. One form or another of E-paper is being developed by Gyricon (a spin-off of Xerox), Philips Electronics, Kent Displays (cholesteric displays), Ntera (electrochromic Nanochromic displays), and many others.

There is a need to develop a colored electronic paper display. In principle, there are two different ways to obtain a colored display. First, one can replace the white particles by colored (RGB/CYM) particles and alternatively, by applying a color filter on top of the electrophoretic display.

A rigid electrophoretic display can use a color filter made on a separate glass substrate. However, this is an expensive approach and not easy to realize due to the necessary lamination of a second glass substrate with the color filter on top of the E-paper. A flexible E-paper cannot use this lamination method at all.

An alternative and cheaper method is to pattern the color filter directly on the E-paper layer. A photosensitive resist composition is used to form a color filter. High sensitivity, adhesion to a substrate, chemical resistance and the like are required for the composition. In general, in order to form a color filter using such a photosensitive resist composition, a light screening layer pattern is formed on a transparent substrate, a photosensitive resist composition having a colorant dispersed therein is applied to the substrate, exposed to radiation through a photo mask to be developed, and unexposed portions are dissolved with a developer to form a pixel pattern. Red, green and blue colorants are used as the colorant. A standard pigmented photo resist composition comprises a resin containing an acidic functional group such as (meth)acrylic acid, a polyfunctional monomer such as pentaerythritol tri(meth)acrylate, and a photopoly-merization initiator.

However, with the existing color filter resists it is difficult to pattern the color filter directly on the electronic paper layer due to the fact that the resists usually need a final curing step at a temperature of at least 200° C. as curing is usually insufficient by only exposing to light. At this temperature the capsules containing the dispersion with the black and white particles will be completely destroyed. Omitting this post-baking step results only in a photo-induced cross-linking of the acrylate monomer up to a degree of about 40-50% depending on the color which is not enough for a sufficient chemical resistance against a second and a third layer in view of the fact that a color filter is built up out of three layers, R, G and B that are made sequentially.

Color filter resists for low temperature applications are described, for example, in JP 2004-083754 A and JP 2003-330184 A. However, the use of extra additives (epoxides, peroxides) in the resist to lower the curing temperature is essential. There is no hint that the heat curing step could be omitted.

KR 10-2009-0104670 A discloses a photosensitive resist composition which enables the formation of a patterned structure or a protective film by low-temperature heating or without heat treatment. The composition comprises (meth)acrylic derivatives of polyglycidylether as a polymerizable compound and a resin having a branched and/or alicyclic structure in the side-chain.

WO 2007/113107 A1 discloses a photosensitive resist composition for low temperature color filter resists using a polyacrylate monomer containing 2 glycidyl acrylate groups. However, the physical resistance of the cross-linked film as well as the adhesion, especially on glass, SiN-coated or plastic substrates do not meet the requirements for suitable color filters. The irradiated parts are often lifted off the substrate after developing.

It is, therefore, an object of the present invention to overcome these disadvantages and to provide a color filter having improved adhesion between the layer of the cured photosensitive resist composition and a substrate.

It is a further object of the present invention to provide a color filter for low temperature applications.

It is still another object of the present invention to provide a color filter for use in a display device, such as an electrophoretic display.

Accordingly, in a first aspect the invention is directed to a color filter comprising a substrate and a cured layer of a photosensitive resist composition comprising
(A) a polyacrylate monomer of formula

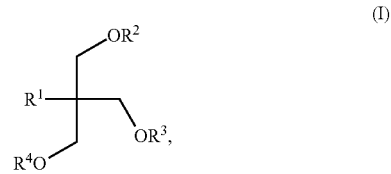

(I)

wherein $R^1$ is methyl or $CH_2OR^5$,
$R^2$, $R^3$, $R^4$ and $R^5$ are independently from each other H or a group of formula

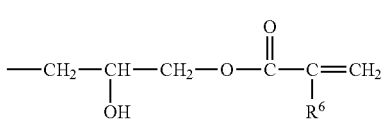 (II)

or a group of formula

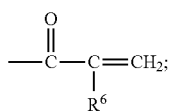 (III)

$R^6$ is independently from each other H or methyl, with the proviso that at least three groups of formula (II) are present;
(B) a binder comprising an alkali soluble copolymer having a side chain containing an ethylenically unsaturated bond, with the proviso that the copolymer does not include a further structural unit containing a branched and/or alicyclic structure in the side chain;
(C) a pigment; and
(D) a photopolymerization initiator.

Preferably, each $R^6$ of the polyacrylate monomer is the same and is H or methyl.

Alkyl, e.g., $C_1$-$C_4$alkyl, $C_1$-$C_8$alkyl, or $C_1$-$C_{12}$alkyl, may be within the given limit of C atoms linear or branched, where possible. Examples are methyl, ethyl, n-propyl, isopropyl, n-butyl, sec-butyl, isobutyl, t-butyl, n-pentyl, 2-pentyl, 3-pentyl, neopentyl, n-hexyl, 1,1,3,3-tetramethylpentyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 2-ethylhexyl, n-nonyl, decyl, undecyl, and dodecyl. Alkoxy is alkyl-O—.

Alkylene, e.g., $C_2$-$C_{18}$alkylene, $C_1$-$C_6$alkylene, or $C_1$-$C_4$alkylene, may be methylene, ethylene, n-, isopropylene, n-, iso, sec-, t-butylene, n-pentylene, neopentylene, n-hexylene, n-heptylene, n-octylene, n-nonylene, n-decylene, n-undecylene, n-dodecylene, n-tridecylene, n-tetradecylene, n-pentadecylene, n-hexydecylene, n-heptydecylene, and n-octadecylene.

Arylene, e.g., $C_6$-$C_{12}$arylene or $C_6$-$C_{18}$arylene, may be phenylene or naphthylene, e.g., o-phenylene, m-phenylene, p-phenylene, 1,4-naphthylene, 1,5-naphthylene or biphenyl-4,4'-diyl.

The above-mentioned groups may be substituted by one or more substituents. Possible substituents are $C_1$-$C_8$alkyl, OH, $C_1$-$C_8$alkoxy, and halogen. If a substituent occurs more than one time in a group, it can be different in each occurrence. Halogen denotes I, Br, Cl, or F, especially Br or Cl.

(Meth)acryl in (meth)acrylic acid or (meth)acrylate denotes acryl and/or methacryl.

The term "cured layer of the photosensitive resist composition" or "pixel" used herein means the final developed and optionally dried coating film of the color filter, in other words, after applying said composition onto a substrate, drying, exposing, developing and optionally drying. In general, the optional drying is only necessary if any volatile substances have to be still removed.

Preferably, the polyacrylate monomer (A) is trimethylolethane triglycerolate tri(meth)acrylate or pentaerythritol tetraglycerolate tetra(meth)acrylate.

In case of $R^1$ being $CH_2OR^5$, one of $R^2$, $R^3$, $R^4$ or $R^5$ may be H or may be replaced with a group of formula

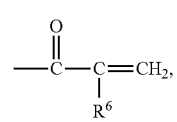 (III)

wherein $R^6$ is H or methyl.

As the polyacrylate monomers of formula (I) may be present as a mixture of polyacrylate monomers of formula (I), the polyacrylate monomer or a mixture thereof may be used as a component (A) within the invention. If necessary, the monomers can be isolated by methods known to one skilled in the art, e.g. chromatography, etc. However, in the context of the present invention, isolation of a single monomer from the mixture is not necessary as such as long as the required content of three groups of formula (II) are present in a polyacrylate monomer of formula (I) of the mixture.

Accordingly, component (A) may preferably be a mixture of polyacrylate monomers of formula

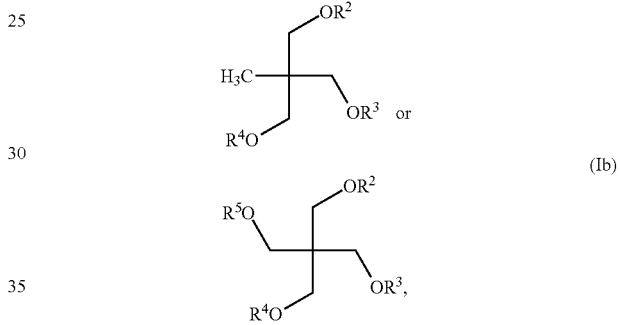

and
a polyacrylate monomer of formula (I), wherein $R^2$, $R^3$, $R^4$ and $R^5$ are independently from each other H or a group of formula

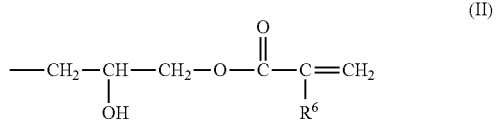 (II)

or a group of formula

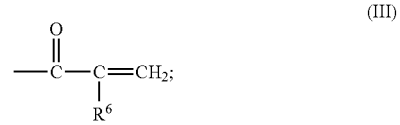 (III)

$R^6$ is independently from each other H or methyl,
with the proviso that at least three groups of formula (II) are present in a monomer.

Especially, component (A) is a mixture of polyacrylate monomers of formula (I), comprising trimethylolethane triglycerolate tri(meth)acrylate or pentaerythritol tetraglycerolate tetra(meth)acrylate. The content of trimethylolethane triglycerolate tri(meth)acrylate may be 15% by weight or higher, preferably at least 20% by weight, more preferably at least 25% and most preferably at least 40% by weight, based on the total weight of polyacrylate monomers of formula (I). The content of pentaerythritol tetraglycerolate tetra(meth) acrylate may be 15% by weight or higher, preferably at least 20% by weight, more preferably at least 25% and most preferably at least 40% by weight, based on the total weight of polyacrylate monomers of formula (I).

The polyacrylate monomers may be used alone or in admixture of two or more. The photosensitive resin may comprise a polymerizable compound having an ethylenically unsaturated bond other than one of formula (I). The further polymerizable compound may be selected from those known in the art. Preferably, only a polyacrylate monomer of formula (I) or a mixture of said monomers as defined above is present in the photosensitive composition.

The amount of polyacrylate monomer (A) in the photosensitive resist composition is generally at least 5 parts by weight, preferably of from 5 to 500 parts by weight, more preferably from 20 to 500 parts by weight, based on 100 parts by weight of the binder (B). An amount of at least 5 parts by weight results in excellent polymerization curability in exposure which makes a conventional post-baking step at 200° C. after developing no longer necessary.

The polyacrylate monomers may be prepared by known methods. For example, compounds of formula (I) may be prepared by reacting the underlying alcohol with epichlorohydrin to form the corresponding polyglycidyl ether, some of these are commercially available. Subsequently, said polyglycidylether may be reacted with an appropriate amount of acrylic compound, for example (meth)acrylic acid, in the presence of a polymerization inhibitor and a catalyst at an elevated temperature, e.g. between 80 to 110° C., for several hours until complete disappearance of the reactants. A variety of catalysts may be used such as triethylamine, dimethylaniline, boron trifluoride, triphenyl phosphine, various metal salts, or any other epoxide ring-opening catalysts well known to those skilled in the art. The catalyst may be added all at once at the beginning of the reaction, or it may be added continuously or in increments over regular intervals during the reaction. Inhibitors are used to prevent undesired polymerization of the (meth)acrylates. Examples include, for instance, hydroquinones, hydroquinone ethers such as hydroquinone monomethyl ether, di-t-butylpyrocatechol, phenothiazine, p-phenylenediamine, Methylene Blue, sterically hindered phenols, and nitroxyls such as TEMPO, and are widely known among those skilled in the art. The proportion of inhibitors individually or as a mixture can generally range from about 0.01 to about 1% weight relative to the weight of the entire reaction mixture.

Compounds of formula (I) may also be prepared by reacting the alcohol as described above with allyl bromide or allyl chloride by a Williamson synthesis to form the corresponding allyl ether. This may be carried out as described, for example in Organic Syntheses, Coll. Vol. 5, p. 251 (1973) or Vol. 46, p. 28 (1966). The allyl ether may also be prepared by applying a Williamson synthesis under phase transfer catalysis in analogy to the method disclosed by M. Stojanowa-Antoszcyszyn et al., Comptes Rendus de l'Academie Bulgare des Sciences, 2001, 54(3), 51. Said polyallyl ether may then be epoxidized by methods known in the art, for example with percarboxylic acids or hydroperoxides. The obtained polyglycidylether may be reacted to the corresponding polyacrylate under conditions as mentioned above.

The binder (component B) used in the present invention comprises an alkali soluble copolymer having a side chain containing an ethylenically unsaturated bond, preferably with the proviso that the copolymer does not include a further structural unit containing a branched and/or alicyclic structure in the side chain. In a preferred aspect, the binder comprises a copolymer having a structural unit containing an acidic group and a structural unit of formula

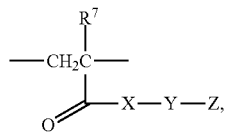

(IV)

wherein
X is O, NH or NR$^8$, preferably O,
R$^8$ is C$_1$-C$_4$alkyl or phenyl;
Y is a divalent organic group with a C$_2$-C$_{18}$ aliphatic and/or aromatic structure which is interrupted by, said Y is optionally interrupted by O;
Z is

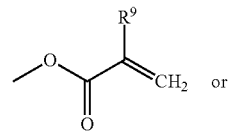

(V)

or

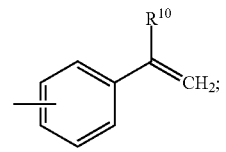

(VI)

R$^7$, R$^9$ and R$^{10}$ are independently from each other H or methyl.

Examples of a C$_2$-C$_{18}$ aliphatic and/or aromatic structure include a C$_2$-C$_{18}$alkylene which may be linear or, where possible, branched and may comprise a terminal or interrupting aromatic structure, e.g. 1,3-phenylene or 1,4-phenylene; and a C$_6$-C$_{18}$arylene such as biphenyl-4,4'-diyl. Said groups are interrupted by —CH(OH)— or —O—CO—NH— and optionally further interrupted by one or more O.

The acidic group may be a —COOH group, a —SO$_2$NHCO— group, a —SO$_3$H group, a phenolic hydroxy group, a —SO$_2$NH— group, or a —CO—NH—CO— group. The copolymer preferably comprises an ethylenically unsaturated monomer having at least one carboxyl group (hereinafter referred to as "carboxyl group-containing unsaturated monomer").

Examples of the carboxyl group-containing unsaturated monomer include unsaturated monocarboxylic acids such as acrylic acid, methacrylic acid, crotonic acid, α-chloroacrylic acid, ethacrylic acid and cinammic acid; unsaturated dicarboxylic acids (anhydrides) such as maleic acid, maleic anhydride, fumaric acid, itaconic acid, itaconic anhydride, citraconic acid, citraconic anhydride and mesaconic acid; unsaturated polycarboxylic acids (anhydrides) having at least three carboxyl groups in the molecule; mono(meth)acryloyloxyalkyl esters of non-polymerizable dicarboxylic acids such as mono(2-acryloyloxyethyl)ester of succinic acid, mono(2-methacryloyloxyethyl)ester of succinic acid, mono (2-acryloyloxyethyl)ester of phthalic acid and mono(2-methacryloyl-oxyethyl)ester of phthalic acid; ω-carboxy-polycaprolactone monoacrylate, ω-carboxy-polycaprolactone monomethacrylate and the like. These carboxyl group-containing unsaturated monomers may be used alone or in admixture of two or more.

Preferably, acrylic acid and/or methacrylic acid are(is) comprised as structural unit in the copolymer of component (B).

Z is preferably

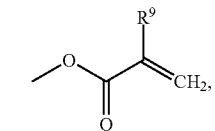

(V)

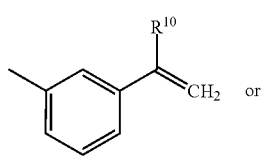

(VIa)

or

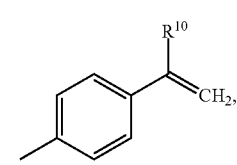

(VIb)

wherein $R^9$ and $R^{10}$ are independently from each other H or methyl.

Preferred groups of formula (IV) are, for example,

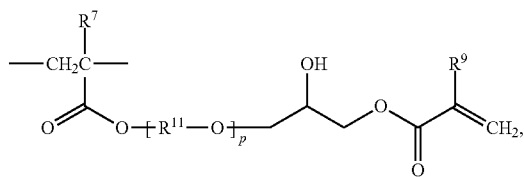

(IVa)

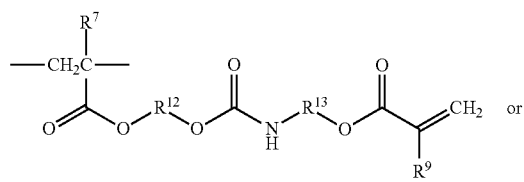

(IVb)

or

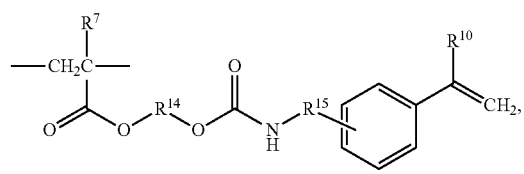

(IVc)

wherein
$R^7$, $R^9$ and $R^{10}$ are independently from each other H or methyl,
$R^{11}$, $R^{12}$, $R^{13}$, $R^{14}$ and $R^{15}$ are independently from each other $C_1$-$C_6$alkylene, preferably $C_1$-$C_4$alkylene, or phenylene, especially methylene, ethylene, propane-1,2-diyl, propane-2,2-diyl, 1,3-phenylene or 1,4-phenylene; and
p is 0, 1, 2, or 3, preferably p is 0 or 1.

The group of formula (IVa), (IVb) or (IVc) may be present alone or in admixture of two or more.

Especially preferred groups of formula (IV) are

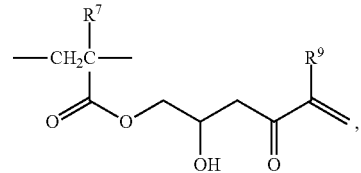

(IVd)

a group of formula (IVa), wherein p is 1 and $R^{11}$ is 1,4-phenylene, ethylene, or propane-1,2-diyl; a group of formula (IVb), wherein $R^{12}$ and $R^{13}$ are the same, preferably ethylene or propane-1,2-diyl; a group of formula (IVc), wherein $R^{14}$ is ethylene or propane-1,2-diyl, $R^{15}$ is methylene, ethylene or propane-1,2-diyl, said $R^{15}$ may be linked in m- or p-position to the substituted phenyl ring. Of particular interest is a group of formula (IVd).

Such copolymers are known in the art and can be prepared using known methods, for example as disclosed in US 2006/229376 A1, US 2003/232259 A1, JP 2005-062621 A, WO 01/13175 A2, and WO 2008/4705 A1. The binder component of the photosensitive resist composition may preferably be a copolymer (B) comprising an acrylic acid and/or a methacrylic acid unit and a unit of formula (IV). Optionally, one or more other copolymerizable ethylenically unsaturated monomers (hereinafter referred to as "other unsaturated monomer") may be present in the copolymer.

It is preferred that the ethylenically unsaturated bond is incorporated via an appropriate functional group, after a linkage of a main chain of the copolymer is formed in accordance with known methods of radical polymerization techniques.

In order to incorporate the structural unit of formula (IVa) with p is 0 into the copolymer, firstly, the main chain portion of the copolymer may be formed by polymerizing at least (meth)acrylic acid as a monomer, and then a carboxyl group from the (meth)acrylic acid may be reacted with glycidyl (meth)acrylate. In this case, however, the amount of glycidyl (meth)acrylate is required to be adjusted as appropriate, since an excessively low content of the carboxyl group from the (meth)acrylic acid causes a lack of the alkali solubility.

In case where p is different from 0, the structural unit of formula (IVa) may be derived from hydroxy-substituted (meth)acrylates of formula

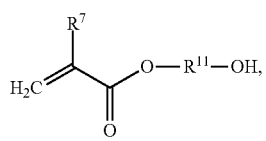

(VII)

wherein $R^7$ and $R^{11}$ are defined as above.

The OH-group may then be reacted with glycidyl (meth)acrylate as described above.

In order to incorporate the structural unit of formula (IVb) into the copolymer, firstly, a main chain portion of the copolymer may be formed by copolymerizing hydroxy-substituted (meth)acrylates of formula

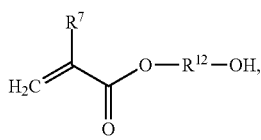

(VIII)

wherein $R^7$ and $R^{12}$ are defined as above, with other monomers. Then, said hydroxy group may be reacted with an isocyanate-terminated compound of the general formula

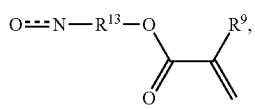

(IX)

wherein $R^{13}$ and $R^9$ are defined as above.

Structural units of formula (IVc) may be prepared accordingly.

Examples of the other unsaturated monomer as mentioned hereinbefore include aromatic vinyl compounds such as styrene, α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, p-vinylbenzyl methyl ether and p-vinylbenzyl glycidyl ether; unsaturated carboxylates such as methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, allyl (meth)acrylate, benzyl (meth)acrylate, phenyl (meth)acrylate and methoxytriethylene glycol (meth)acrylate; unsaturated aminoalkyl carboxylates such as 2-aminoethyl (meth)acrylate, 2-dimethylaminoethyl (meth)acrylate, 2-aminopropyl (meth)acrylate, 2-dimethylaminoproyl (meth)acrylate, 3-aminopropyl (meth)acrylate and 3-dimethylaminopropyl (meth)acrylate; unsaturated glycidyl carboxylates such as glycidyl (meth)acrylate; vinyl carboxylates such as vinyl acetate, vinyl propionate, vinyl butyrate and vinyl benzoate; unsaturated ethers such as vinylmethyl ether, vinylethyl ether, allyl glycidyl ether and methallyl glycidyl ether; vinyl cyanide compounds such as (meth)acrylonitrile, α-chloroacrylonitrile and vinylidene cyanide; unsaturated amides and unsaturated imides such as (meth)acrylamide, α-chloroacrylamide, N-(2-hydroxyethyl)(meth)acrylamide, maleimide, N-phenylmaleimide and N-cyclohexyl-maleimide; aliphatic conjugated dienes such as 1,3-butadiene; macromonomers having a mono(meth)acryloyl group at the terminal of a polymer molecular chain such as polystyrene, polymethyl (meth) acrylate, poly-n-butyl (meth)acrylate, and polysiloxane; and the like. These other unsaturated monomers may be used alone or in admixture of two or more.

Preferably, the copolymer (B) comprises at least one monomer unit selected from the group consisting of styrene, methyl (meth)acrylate, ethyl (meth)acrylate, n-propyl (meth) acrylate, n-butyl (meth)acrylate, 2-hydroxyethyl (meth)acrylate, allyl (meth)acrylate, benzyl (meth)acrylate, phenyl (meth)acrylate, glycerol mono(meth)acrylate, N-phenylmaleimide, polystyrene macromonomer and polymethyl (meth) acrylate macromonomer.

In a preferred aspect, the copolymer (B) consists of
(a) a structural unit having an acidic group, preferably (meth) acrylic acid,
(b) at least one monomer selected from the group consisting of styrene, methyl (meth)acrylate, ethyl (meth)acrylate, n-propyl (meth)acrylate, n-butyl (meth)acrylate, 2-hydroxyethyl (meth)acrylate, allyl (meth)acrylate, benzyl (meth)acrylate, phenyl (meth)acrylate, glycerol mono (meth)acrylate, N-phenylmaleimide, polystyrene macromonomer and polymethyl (meth)acrylate macromonomer, preferably methyl (meth)acrylate, n-butyl (meth) acrylate, styrene, 2-hydroxyethyl (meth)acrylate and benzyl (meth)acrylate, and
(c) a monomer unit of formula (IV), preferably a monomer unit of formula (IVa).

More preferably, the copolymer (B) may consist of
(a) 5 to 50% by weight, preferably 10 to 40% by weight and more preferably 10 to 30% by weight, based on the total weight of the copolymer, of a monomer unit containing the acidic group, preferably (meth)acrylic acid;
(b) 40 to 90% by weight, preferably 50 to 85% by weight and more preferably 60 to 80% by weight, based on the total weight of the copolymer, of at least one monomer unit selected from the group consisting of styrene, methyl (meth)acrylate, ethyl (meth) acrylate, n-butyl (meth)acrylate, 2-hydroxyethyl (meth)acrylate, allyl (meth)acrylate, benzyl (meth)acrylate, phenyl (meth)acrylate, glycerol mono(meth)acrylate, N-phenylmaleimide, polystyrene macromonomer and polymethyl (meth)acrylate macromonomer;
(c) 2 to 30% by weight, preferably 5 to 20% by weight, based on the total weight of the copolymer, of a monomer unit of formula (IV), preferably a monomer unit of formula (IVa), more preferably a monomer unit of formula (IVd).

A content ratio of each structural unit constituting the molecular structure of the copolymer (B) is adjusted as appropriate. The amount of the acidic monomer is adjusted to satisfy the required alkali solubility and the required solvent solubility. The amount of the monomer containing the ethylenically unsaturated bond is adjusted to satisfy the required photocurable extent (sensitivity).

The proportion of the carboxyl group-containing unsaturated monomer in component (B) is generally 5 to 50 wt %, more preferably 10 to 40 wt %, more preferably 10 to 30 wt %. When the proportion of the carboxyl group-containing unsaturated monomer is less than 5 wt %, the solubility in an alkali developer of the obtained radiation sensitive composition is liable to lower, while when the proportion is more than 50 wt %, the formed pixel pattern is apt to fall off from the substrate or the surface of the pixel is apt to be roughened at the time of development with an alkali developer.

Preferably, the copolymer (B) consists of
(a) 5 to 50% by weight, preferably 10 to 40% by weight and more preferably 10 to 30% by weight, based on the total weight of the copolymer, of (meth)acrylic acid;
(b) 40 to 90% by weight, preferably 50 to 85% by weight and more preferably 60 to 80% by weight, based on the total weight of the copolymer, of at least one monomer unit selected from the group consisting of methyl (meth)acrylate, ethyl (meth)acrylate, n-butyl (meth)acrylate, styrene, 2-hydroxyethyl (meth)acrylate and benzyl (meth)acrylate;
(c) 2 to 30% by weight, preferably 5 to 20% by weight, based on the total weight of the copolymer, of a monomer unit of formula (IVa).

Accordingly, in a preferred aspect the invention relates to a color filter comprising a substrate and a cured layer of a photosensitive resist composition comprising (A) a polyacrylate monomer of formula

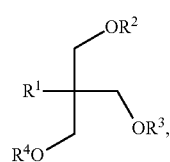

(I)

wherein $R^1$ is methyl or $CH_2OR^5$,
$R^2$, $R^3$, $R^4$ and $R^5$ are independently from each other H or a group of formula

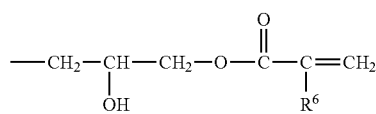

(II)

or a group of formula

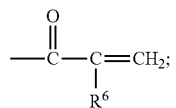

(III)

$R^6$ is independently from each other H or methyl,
with the proviso that at least three groups of formula (II) are present; or a mixture of the polyacrylate monomer of formula (I) comprising trimethylolethane triglycerolate tri(meth)acrylate or pentaerythritol tetraglycerolate tetra(meth)acrylate;
(B) an alkali-soluble copolymer consisting of
(a) 5 to 50% by weight, preferably 10 to 40% by weight and more preferably 10 to 30% by weight, based on the total weight of the copolymer, of the monomer unit containing the acidic group;
(b) 40 to 90% by weight, preferably 50 to 85% by weight and more preferably 60 to 80% by weight, based on the total weight of the copolymer, of at least one monomer unit selected from the group consisting of methyl (meth)acrylate, n-butyl (meth)acrylate, styrene, 2-hydroxyethyl (meth)acrylate or benzyl (meth)acrylate;
(c) 2 to 30% by weight, preferably 5 to 20% by weight, based on the total weight of the copolymer, of a monomer unit of formula (IV);
(C) a pigment; and
(D) a photopolymerization initiator.

Usually, the amount of the monomer containing an ethylenically unsaturated bond in the copolymer (B) is lower than the monomer containing the acidic group. For example, the molar ratio of the monomer containing the ethylenically unsaturated bond to the monomer containing the acidic group may be in the range of from 1:19 to 1:2, preferably 1:9 to 1:3, more preferably 1:6 to 1:4.

Accordingly, in a preferred aspect the invention relates to a color filter, wherein the copolymer (component (B)) in the photosensitive resist composition has a molar ratio of the structural unit containing an acidic group to the structural unit of formula (IV) of from 9:1 to 3:1, preferably 6:1 to 4:1.

The amount of other unsaturated monomers (c) in the polymer main chain may be of from 40 to 90 mol %, preferably 40 to 80 mol % and more preferably 50 to 80 mol %, and most preferably 60 to 75 mol %, based on the total amount of the monomers in the main chain. An especially preferred copolymer is a copolymer comprising (meth)acrylic acid and at least one other unsaturated monomer, before functionalizing in a molar ratio of 1:4 to 1:1, preferably 1:1.5 to 1:2.5, wherein the molar ratio of the monomer containing the ethylenically unsaturated bond to the monomer containing the acidic group may be after functionalizing in the range of from 1:19 to 1:2, preferably 1:9 to 1:3, more preferably 1:6 to 1:4.

Accordingly, a preferred copolymer consists of monomer units of
(a) (meth)acrylic acid,
(b) at least one monomer unit selected from the group consisting of methyl (meth)acrylate, n-butyl (meth)acrylate, styrene, 2-hydroxyethyl (meth)acrylate or benzyl (meth)acrylate; and
(c) a monomer unit of formula (IVa), preferably a monomer unit of formula (IVd).

A particularly preferred copolymer is obtainable by polymerizing
(a) (meth)acrylic acid, and
(b) at least one monomer selected from the group consisting of methyl (meth)acrylate, n-butyl (meth)acrylate, styrene, 2-hydroxyethyl (meth)acrylate or benzyl (meth)acrylate, in a molar ratio of (a) to (b) of from 1:4 to 1:1;
followed by functionalizing the acidic group of (a) to form at least one unit of formula

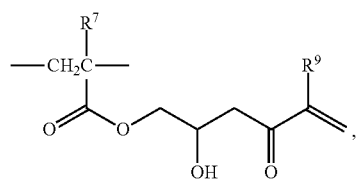

(IVd)

wherein the molar ratio of (a) to (IVd) in the final copolymer is of from 9:1 to 3:1, preferably of from 6:1 to 4:1.

An especially preferred copolymer (B') is obtainable by polymerizing
(a) (meth)acrylic acid, and
(b) at least one monomer selected from the group consisting of methyl (meth)acrylate, n-butyl (meth)acrylate, styrene, 2-hydroxyethyl (meth)acrylate or benzyl (meth)acrylate, in a molar ratio of (a) to (b) of from 1:1.5 to 1:2.5;
followed by functionalizing the acidic group of (a) to form at least one unit of formula (IVd), wherein the molar ratio of (a) to (IVd) in the final copolymer is of from 6:1 to 4:1.

The copolymer (B) of the binder component may be a random copolymer, or may be a block copolymer. Also, mixtures of the afore-mentioned copolymers may be used in the inventive composition.

The copolymer usually have a weight average molecular weight in terms of polystyrene measured by gel permeation chromatography (GPC: tetrahydrofuran as a solvent) (hereinafter referred to as "weight average molecular weight" Mw) of 1,000 to 300,000 g/mol, preferably 2,000 to 100,000, more preferably 5,000 to 50,000 and most preferably 5,000 to 25,000. The ratio of the weight average molecular weight to the number average molecular weight is preferably 1 to 5, more preferably 1.5 to 4, especially 2 to 3.5.

By using the binder having such specific weight average molecular weight, a radiation sensitive composition having excellent developability can be obtained, whereby a pixel array having a sharp pattern edge can be formed, and stains, film residues or the like are hardly produced in an area other than a portion of the substrate where pixels are formed at the time of development.

The amount of the binder used in the present invention is generally of from 10 to 1,000 parts by weight, preferably 20 to 500 parts by weight based on 100 parts by weight of the pigment (C).

Particularly, the copolymer (B) having a structural unit containing an acidic group and a structural unit containing an ethylenically unsaturated bond and optionally another unsaturated monomer in the above specified proportion has excellent solubility in an alkali developer. In a radiation sensitive composition containing the copolymer as a binder, an undissolved product rarely remains after development with an alkali developer, stains or film residues are hardly produced in an area other than a portion of the substrate where pixels are formed, and a pixel pattern obtained from the composition is not dissolved excessively in the alkali developer, has excellent adhesion to the substrate and does not fall off from the substrate.

In the invention, binder resins other than the copolymer (B) may be additionally used within a range to achieve the object of the invention. Other binder resins may be a copolymer comprising at least two kinds of monomer selected from (meth)acrylic acid, methyl (meth)acrylate, 2-hydroxyethyl (meth)acrylate, ethyl (meth)acrylate, n-butyl (meth)acrylate, benzyl (meth)acrylate, phenyl (meth)acrylate, styrene, polystyrene macromonomer and polymethyl (meth)acrylate macromonomer. Among these a copolymer of (meth)acrylic acid and benzyl (meth)acrylate, a copolymer of (meth)acrylic acid, benzyl (meth)acrylate and styrene, a copolymer of benzyl (meth)acrylate and styrene, a copolymer of benzyl (meth)acrylate and styrene macromonomer and the like are preferred.

The pigment (C) in the present invention is not limited to a particular color and is suitably selected according to the application purpose of a color filter. It may be either organic or inorganic. Preferably, the photosensitive resist composition comprises a pigment (C) which is selected from the group consisting of an organic pigment and carbon black. An organic pigment is more preferred.

Examples of the inorganic pigments also include inorganic salts called "extender pigment" and the like. Since highly accurate color development and heat resistance are required for color filters, the pigment used in the present invention preferably has high color developing properties and high heat resistance, particularly high thermal decomposition resistance. An organic pigment and/or carbon black are/is generally used, and an organic pigment and/or carbon black is/are particularly preferred.

Examples of the organic pigment which can be used in the photosensitive composition as described herein are shown below with color index numbers.

For a red colored composition for forming red filter segments, a red pigment such as C.I. Pigment Red 2, 4, 5, 7, 9, 14, 23, 41, 48:1, 48:2, 48:3, 48:4, 52:2, 53:1, 57, 57:1, 81:1, 81:2, 81:3, 88, 89, 97, 101, 104, 112, 122, 123, 144, 146, 149, 166, 168, 177, 178, 180, 181, 184, 185, 187, 190, 192, 194, 200, 202, 204, 206, 207, 208, 210, 214, 215, 216, 217, 220, 221, 222, 223, 224, 226, 227, 228, 240, 242, 246, 254, 255, 262, 264, 270, 272, 279, Vat Red 74, 3,6-di(3'-cyanophenyl)-2,5-dihydropyrrolo[3,4-c]-pyrrole-1,4-dione or 3-phenyl-6-(4'-t-butylphenyl)-2,5-dihydropyrrolo[3,4-c]pyrrole-1,4-dione can be used. A yellow pigment or an orange pigment can be additionally used in the red-colored composition.

For a yellow-colored composition for forming yellow filter segments, a yellow pigment such as C.I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 111, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 184, 185, 187, 188, 191, 191:1, 193, 194, 199, 213, or 214 can be used.

For an orange-colored composition for forming orange filter segments, an orange pigment such as C.I. Pigment Orange 5, 13, 16, 34, 36, 40, 43, 48, 49, 51, 55, 59, 61, 64, 71 or 73 can be used.

For a green-colored composition for forming green filter segments, a green pigment such as C.I. Pigment Green 7, 10, 17, 36, 37, 50 or 58 can be used. A yellow pigment can be additionally used in combination in the green-colored composition.

For a blue-colored composition for forming blue filter segments, a blue pigment such as C.I. Pigment Blue 1, 15, 15:1, 15:2, 15:3, 15:4, 15:6, 16, 22, 28, 29, 58, 60, 64, 66 or 80 can be used. A violet pigment such as C.I. Pigment Violet 1, 19, 23, 27, 29, 30, 32, 37, 40, 42 or 50 can be additionally used in the blue-colored composition.

For a cyan-colored composition for forming cyan filter segments, a blue pigment such as C.I. Pigment Blue 15:1, 15:2, 15:3, 15:4, 15:6, 16 or 81 can be used. A green pigment such as C.I. Pigment Green 7 can be additionally used in the cyan-colored composition.

For a magenta-colored composition for forming magenta filter segments, a violet pigment and a red pigment such as C.I. Pigment Violet 1 and 19, and C.I. Pigment Red 144, 146, 177, 169 and 81 can be used. A yellow pigment can be additionally used in the magenta-colored composition.

Further, as a black pigment for black matrices, carbon black, titanium black, aniline black, an anthraquinone black pigment, a perylene black pigment, specifically, C.I. Pigment Black 1, 6, 7, 12, 20, 27, 30, 31 or 32 can be used. Among these, carbon black is preferable. The surface of carbon black may be treated with, e.g., a resin.

Further, a preferred black pigment is a bis-oxodihydroindolylene-benzodifuranone colorant of formula

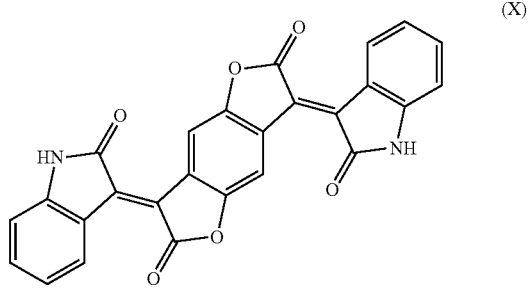 [SMILES: O=C1Nc2ccccc2/C1=C1\C(=O)Oc2cc3c(cc21)OC(=O)/C3=C1/C(=O)Nc2ccccc21]

(X)

or a cis-trans isomer thereof,
which may be variously substituted as described, for example, in WO 00/24736 A1, especially the compound according to example 12b, which is incorporated herein. Said pigments are further described in WO 09/10521, WO 2010/81624 and WO 2010/81624. The pigment is preferably unsubstituted.

Further, examples of inorganic pigment include titanium oxide, barium sulfate, zinc sulfide, lead sulfate, yellow lead, zinc yellow, red iron(III)oxide, cadmium red, navy blue, Prussian blue, chromium oxide green, cobalt green, amber, and synthetic iron black. The inorganic pigment may be used in combination with the organic pigment for securing good coating property, sensitivity, developing property and the like while balancing chroma with brightness.

The photosensitive composition described herein may contain a dye for toning in an amount not lowering thermal resistance. Preferably, no dye is used in the inventive compositions.

Of the inorganic pigments, carbon black is particularly preferred.

In the present invention, the above pigments may be used alone or in admixture of two or more.

The surface of each of these pigments may be modified with a polymer before use. The polymer for modifying the surface of the pigment may be a polymer disclosed in JP 08-259876 A, a commercial polymer or oligomer for dispersing a pigment, or the like.

The pigment in the present invention may be used in combination with a dispersant or dispersion aid.

Examples of the dispersant include polycarboxylates such as polyurethanes and polyacrylates; unsaturated polyamides; (partial) amine salts, ammonium salts and alkyl amine salts of polycarboxylic acids; polysiloxanes; long-chain polyaminoamide phosphates; hydroxyl group-containing polycarboxylates; and modified products thereof; amides formed by reacting polyesters having a free carboxylic acid group with poly(lower alkylene imines) and salts thereof; and the like, under the trade name of Disperbyk®-130, 101, 160, 161, 162, 163, 164, 165, 166, 170, 171, 182, 2000, 2001, 2050, 2070 and the like, EFKA® 44, 46, 47, 48, 4010, 4015, 4020, 4044, 4046, 4047, 4050, 4055, 4060, 4330, 4340 and the like, Ajisper PB-821, 822, 823, Solsperse® 13240, 13940, 17000, 24000GR, 28000, 20000, 12000, 27000, 32000, 32500 and the like.

The dispersant or dispersion aid is, for example, a cationic, anionic, nonionic or amphoteric surfactant, or a silicone-based or fluorine-based surfactant.

Examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethyleneimines; and the like, under the trade name of KP, Polyflow, F-Top, Megafax, Florade, Asahi Guard and Surflon and the like.

These dispersants may be used alone or in admixture of two or more.

The dispersant is generally used in an amount of 50 parts or less by weight, preferably 20 to 40 parts by weight, based on 100 parts by weight of the pigment.

The dispersant aid may be a pigment derivative obtained by treating a pigment with an acid, base or polymer. Examples of the dispersant aid include blue pigment derivatives such as copper phthalocyanine derivatives; yellow pigment derivatives; and the like.

In addition to the pigments mentioned above, the pigments may also include pigment derivatives. Pigment derivatives are generally pigment chromophores substituted by apolar or (usually) polar groups, typically $C_4$-$C_{30}$alkyl, $C_4$-$C_{30}$alkoxy, $C_4$-$C_{30}$alkylthio, aminomethyl, sulpho, carboxyl, amidosulphonyl or amidocarbonyl groups. Such pigment derivatives are often referred to as synergists in the field of color filters. Any known pigment derivative can be used.

Known synergists include, for example, commercially available products, for example Solsperse® 5000, 12000 or 22000.

The term "photopolymerization initiator (D)" as used herein means a compound which forms radical, cationic or anionic active species capable of starting the polymerization of component (A) due to the decomposition or cleavage of a bond caused by exposure.

The photopolymerization initiator is a compound having a bis-imidazole ring, benzoin-based compound, acetophenone-based compound, benzophenone-based compound, α-diketone-based compound, polynuclear quinone-based compound, xanthone-based compound, or triazine-based compound, as disclosed, for example, in WO 2007/113107 A1, p. 22, I.16 to p. 25, I.4.

Examples of the bis-imidazole-based compounds are 2,2'-bis(2-chlorophenyl)-4,4',5,5'-tetrakis(4-ethoxycarbonylphenyl)-1,2'-biimidazole and 2,2'-bis(2-bromophenyl)-4,4',5,5'-tetrakis(4-ethoxycarbonyphenyl)-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4', 5,5'-tetraphenyl-1,2'-biimidazole. These bis-imidazole-based compounds have excellent solubility in a solvent and do not produce foreign matter such as undissolved product and deposit. In addition, they have high sensitivity, fully promote a curing reaction by exposure with a small amount of energy, provide high contrast and are free from a curing reaction in an unexposed portion. Therefore, the exposed coating films of these compounds are clearly divided into cured portions insoluble in a developer and uncured portions highly soluble in the developer, thereby making it possible to form a color filter having no partial or complete loss or undercut of a pixel pattern.

Examples of the benzoin-based compound include benzoin, benzoin methylether, benzoin ethylether, benzoin isopropylether, benzoin isobutylether, methyl-2-benzoyl benzoate and the like.

Examples of the acetophenone-based compound include 2,2-dimethoxy-2-phenylacetophenone, 2-hydroxy-2-methyl-1-phenylpropan-1-one, 1-(4-isopropylphenyl)-2-hydroxy-2-methylpropan-1-one, 4-(2-hydroxyethoxy)phenyl-(2-hydroxy-2-propyl)ketone, 2,2-dimethoxyacetophenone, 2,2-diethoxyacetophenone, 2-methyl-(4-methylthiophenyl)-2-morpholino-1-propan-1-one, 2-benzyl-2-dimethylamino-1-(4-morpholinophenyl)butan-1-one, 1-hydroxycyclohexylphenyl ketone, 2,2-dimethoxy-1,2-diphenylethan-1-one and the like.

Examples of the benzophenone-based compound include 4,4'-bis(dimethylamino)-benzophenone, 4,4'-bis(diethylamino)benzophenone and the like.

Examples of the α-diketone-based compound include diacetyl, dibenzoyl, methylbenzoyl formate and the like.

Examples of the polynuclear quinone-based compound include anthraquinone, 2-ethylanthraquinone, 2-t-butylanthraquinone, 1,4-naphthoquinone and the like.

Examples of the xanthone-based compound include xanthone, thioxanthone, 2-chlorothioxanthone and the like.

Examples of the triazine-based compound include 1,3,5-tris(trichloromethyl)-s-triazine, 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'- methoxyphenyl)-s-triazine, 2-(2'-furylethylidene)-4,6-bis(trichloromethyl)-s-triazine, 2-(4'-methoxystyryl)-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, 2-(2'-thiophenylethylidene)-4,6-bis(trichloromethyl)-s-triazine and the like.

Of the above benzoin-based, acetophenone-based, benzophenone-based, α-diketone-based, polynuclear quinone-based, xanthone-based and triazine-based compounds, 2-hydroxy-2-methyl-1-phenylpropan-1-one, 2-methyl-(4-methylthiophenyl)-2-morpholino-1-propan-1-one and 2-benzyl-2-dimethylamino-1-(4-morpholinophenyl)butan-1-one are preferred because the formed pixel pattern hardly falls off from the substrate at the time of development and the pixel strength and sensitivity are high.

The photoinitiators mentioned above may be used alone or in combination of two or more.

In the present invention, the photoinitiators mentioned above may be used in combination with at least one member selected from the group consisting of a sensitizer, a curing promoting agent and a photo-crosslinking agent or photosensitizer composed of a polymer compound as required.

Examples of the sensitizer include 4,4'-bis(dimethylamino)benzophenone, 4,4'-bis(diethylamino)benzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal)cyclohexanone, 7-diethylamino-3-(4-diethylaminobenzoyl)coumarin, 4-(diethylamino)chalcone and the like.

Examples of the curing promoting agent include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole, 3-mercapto-4-methyl-4H-1,2,4-triazole and the like.

Further, the polymeric photo-crosslinking/sensitizing agent is a polymer compound having a functional group which can function as a photo-crosslinking agent and/or photosensitizing agent in the main chain and/or side chain. Examples of the polymeric photo-crosslinking/sensitizing agent include a condensate of 4-azidobenzaldehyde and polyvinyl alcohol, condensate of 4-azidobenzaldehyde and phenol novolak resin, homopolymer and copolymer of 4-acryloylphenylcinnamoyl ester, 1,4-polybutadiene, 1,2-polybutadiene and the like.

The amount of the photopolymerization initiator in the present invention is generally 0.01 to 200 parts by weight, preferably 1 to 120 parts by weight, particularly preferably 1 to 50 parts by weight based on 100 parts by weight of the total of component (A). When the amount of the photopolymerization initiator is smaller than 0.01 parts by weight, curing by exposure is insufficient with the result that a pixel pattern may be partially or completely lost or undercut. On the other hand, when the amount is larger than 200 parts by weight, the formed pixel pattern easily falls off from the substrate at the time of development, and stains or film residues are readily produced in an area other than a portion where pixels are formed.

The photosensitive resist composition may further contain various additives.

The photosensitive resist composition may contain a storage stabilizer for stabilizing the viscosity of the composition over time. Examples of the storage stabilizer include quaternary ammonium chlorides such as benzyltrimethyl chloride and diethylhydroxyamine, organic acids such as lactic acid and oxalic acid and methyl ether thereof, t-butylpyrocatechol, organic phosphines such as tetraethylphosphine and tetraphenylphosphine, and a salt of phosphorous acid. The storage stabilizer may be used by an amount of 0.1% to 10% by weight, based on the weight of the pigment (C).

Examples of the additives include dispersion aids for blue pigment derivative exemplified by copper phthalocyanine derivative and yellow pigment derivative; fillers such as glass and alumina; polymer compounds such as polyvinyl alcohol, polyethylene glycol monoalkyl ether and poly(fluoroalkylacrylate); surfactants such as nonionic surfactant, cationic surfactant and anionic surfactant; bond promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyl trimethoxysilane and 3-mercaptopropyltrimethoxysilane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; and agglomeration inhibitors such as sodium polyacrylate.

All the above components of the present photosensitive resist composition excluding the component (C) are generally dissolved in an appropriate solvent to prepare a liquid composition.

Any solvents are acceptable as long as they can disperse or dissolve and do not react with the components and the additives and have appropriate volatility.

Examples of the solvent include (poly)alkylene glycol monoalkyl ethers such as ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate and propylene glycol monoethyl ether acetate; other ethers such as diethylene glycol dimethyl ether, diethylene glycol methyl ethyl ether, diethylene glycol diethyl ether and tetrahydrofuran; ketones such as methyl ethyl ketone, cyclohexanone, 2-heptanone and 3-heptanone; alkyl lactates such as methyl 2-hydroxypropionate and ethyl 2-hydroxypropionate; other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, isopropyl acetate, n-butyl acetate, isobutyl acetate, n-amyl acetate, isoamyl acetate, n-butyl propionate, ethyl butyrate, n-propyl butyrate, isopropyl butyrate, n-butyl butyrate, methylpyruvic acid, ethylpyruvic acid, n-propylpyruvic acid, methyl acetoacetate, ethyl acetoacetate and ethyl 2-oxobutyrate; aromatic hydrocarbons such as toluene and xylene; carboxylic acid amides such as N-methylpyrrolidone, N,N-dimethylformamide, and N,N-dimethylacetoamide; and the like. These solvents may be used alone or in admixture of two or more.

A high-boiling solvent such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate can be used in combination with the solvent. These high-boiling solvents may be used alone or in admixture of two or more.

Of the above solvents, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, ethyl 2-hydroxypropionate, 3-methyl-3-methoxybutyl propionate, ethyl 3-methoxypropionate, methyl 3-ethoxypropionate, ethyl 3-ethoxypropionate, n-butyl acetate, isobutyl acetate, n-amyl acetate, isoamyl acetate, n-butyl propionate, ethyl butyrate, isopropyl butyrate, n-butyl butyrate and ethylpyruvic acid are preferred from the viewpoint of solubility, pigment dispersibility and coating properties, and of the above high-boiling solvents, γ-butyrolactone is preferred.

The amount of the solvent in the present invention is generally 100 to 10,000 parts by weight, preferably 500 to 5,000 parts by weight based on 100 parts by weight of the binder (B).

In a preferred aspect, the invention relates to a color filter, wherein the photosensitive resist composition in the uncured state comprises the binder (B) in an amount of 10 to 1,000 parts by weight, based on 100 parts by weight of the pigment (C), the polyacrylate monomer (A) in an amount of 5 to 500 parts by weight, based on 100 parts by weight of the binder (B), and the photopolymerization initiator (D) in an amount of 0.01 to 200 parts by weight, based on 100 parts by weight of the total of the polyacrylate monomer (A).

The photosensitive composition described herein can be prepared in the form of a solvent developing type or alkali developing type colored resist. The resist can be prepared by dispersing the pigment, and the above-mentioned additional substances. It is preferable that grains of 5 μm or more, preferably 1 μm or more and more preferably 0.5 μm or more and mixed dusts are removed by means of, e.g., centrifugal separation, a sintered filter or a membrane filter from the photosensitive composition.

The color filter preferably comprises a cured layer of the photosensitive resist composition as defined in any aspect hereinbefore formed on a substrate, especially on a transparent substrate, wherein the content of the pigment in the layer is 0.02 to 1.5 g/m².

The color filter may comprise a pixel disposed on the transparent substrate, and optionally, the color filter comprises a black matrix, wherein the pixel and/or the black matrix are formed by curing the inventive photosensitive resist composition.

Preferably, the color filter comprises pixels composed of at least three colors on a transparent substrate and a black matrix which separates the pixels, said pixels and/or black matrix are formed by curing the photosensitive resist composition. More preferably, the color filter comprises at least one red filter segment, at least one green filter segment and at least one blue filter segment.

The color filter of the present invention usually has at least one filter segment which is formed using the photosensitive composition described herein. The color filter includes an additive mixture type which comprises at least one red filter segment, at least one green filter segment and at least one blue filter segment, and a subtractive mixture type which comprises at least one magenta filter segment, at least one cyan filter segment and at least one yellow filter segment.

The substrate used to form the color filter may be a glass substrate or a plastic substrate. Usually, the substrate is made of glass such as soda glass, Pyrex® glass or quartz glass, or flexible glass materials like non-alkali glass containing no alkali component in the glass, e.g. "1737 glass" available from Corning. Further, SiN coated substrates, silicon or plastic substrates like polycarbonate, polyester, aromatic polyamide, polyamideimide, polyimide, polyethersulfone or the like are suitable. The transparent substrate can be subjected to a suitable pre-treatment such as chemical treatment with a silane coupling agent or the like, plasma treatment, ion plating, sputtering, gas vapor reaction process or vacuum vapor deposition. A transparent substrate such as glass substrate or a polyester sheet, especially a polyethylene terephthalate (PET) sheet, or a substrate provided with a transparent electro conductive film is preferred.

The photosensitive resist composition described herein is particularly useful for temperature sensitive substrates suitable for devices such as an electrophoretic display (EPD), LCD display or a organic light emitting diode display (OLED).

The photosensitive resist composition may be coated on an electrophoretic display such as E-paper, which generally comprises a plastic film comprising electrophoretic particles. For example the composition may be coated on the plastic film of the electrophoretic display or on a transparent electroconductive film provided thereon. The composition may also be coated on a liquid crystal display like a polymer dispersed liquid crystal display (PDLC), which generally comprises droplets of liquid crystals dispersed in a solid polymer matrix. For example, the composition may be coated on said polymer matrix or on a transparent electro conductive film provided thereon. Moreover, the composition may be coated on an organic light emitting diode display (OLED), for example on an outer layer like an electro conductive film like an ITO film.

Accordingly, in a preferred aspect of the invention, the substrate is a temperature sensitive substrate comprising a display device, such as an electrophoretic display, a polymer dispersed liquid crystal display or an organic light emitting diode display. The term "temperature sensitive substrate" means that the substrate may be subjected to a maximum temperature of 90° C. without deteriorating.

In a second aspect the invention is directed to a method for producing a color filter, which process comprises the steps of coating the photosensitive resist composition as defined herein-before on a substrate, followed by drying, exposing and developing to form a film.

The thus produced color filter is also an aspect of the invention. Advantageously, no post-baking step at a temperature of at least 200° C. follows after the development. After developing, the resulting layer is usually dried in order to remove any volatile substances or solvent, in general at a temperature of room temperature (20-25° C.) up to 90° C., preferably lower, at about 50 to 70° C.

Preferably, the method of producing the color filter, as defined herein-before, comprises the steps of coating the photosensitive resist composition onto a substrate, followed by drying, exposing, developing to form a film, and subsequently drying said developed film at a temperature of from 20 to 70° C., preferably 50 to 70° C.

The color filter of the present invention can be prepared by forming respective filter segments on a substrate using the photosensitive composition by a photolithographic method.

The formation of the respective color filter segments by the photolithographic method can be carried out as follows. That is, the photosensitive composition prepared in the form of a solvent developing type or alkali developing type colored resist is coated on a transparent substrate by a coating method such as spray coating, spin coating, slit coating or roll coating to a thickness of 0.2 to 5 μm when dried. Then, ultraviolet exposure is carried out on the dried coating through a mask having a predetermined pattern provided on the coating in a contact or non-contact state. Then, the uncured portion is removed by immersing the coating in a solvent or alkali developing liquid or by spraying the developing liquid with, e.g., a spray onto the coating. Similar operations are repeated for other colors, preparing the color filter. The photolithographic method can produce color filters having higher precision than those produced by a printing method.

As the alkali developing liquid, an aqueous solution of, e.g., sodium carbonate or sodium hydroxide can be used. Also, an organic alkali such as dimethylbenzylamine or triethanolamine can be used. An anti-foaming agent or a surfactant can be added to the developing liquid. An aqueous developing liquid is preferred.

Further, ultraviolet exposure can be also carried out after coating a water-soluble or alkali-soluble resin, such as a polyvinyl alcohol or a water-soluble acrylic resin on the coated and dried colored resist, and drying the coated resin to form a film which prevents polymerization inhibition caused by oxygen, in order to increase the sensitivity of ultraviolet exposure.

A more detailed description of a method of forming a color filter using the photosensitive resist composition described herein is subsequently given.

A light screening layer is first formed to define a portion for forming pixels on the surface of a transparent substrate. A liquid photosensitive resist composition having, for example, a red pigment dispersed therein is coated on this substrate to form a layer. Thereafter, the layer is exposed to radiation through a photo mask and developed with an alkali developer to dissolve and remove unexposed portions of the coating film to form an array of red pixels arranged in a predetermined pattern.

Thereafter, liquid photosensitive resist compositions having green and blue pigments dispersed therein are coated, exposed and developed in the same manner as described above to form arrays of green pixels and blue pixels on the same substrate sequentially. Thus, a color filter having arrays of three red, green and blue pixels arranged on the substrate is obtained.

Rotation coating, cast coating, roll coating or the like can be suitably employed to coat the liquid radiation sensitive composition on the transparent substrate.

The thickness of the layer or coating after drying is generally of from 0.1 to 10 μm, preferably 0.2 to 5.0 μm, particularly preferably 0.2 to 3.0 μm.

The radiation used to form a color filter is selected from visible light, ultraviolet light, far ultraviolet light, electron beams, X-rays and the like. It preferably has a wavelength of 190 to 450 nm.

The irradiation energy of the radiation is preferably of from 1 to 1,000 mJ/cm$^2$.

The alkali developer is preferably an aqueous solution of sodium carbonate, sodium hydroxide, potassium hydroxide, tetramethyl ammonium hydroxide, choline, 1,8-diazabicyclo[5.4.0]-7-undecene, 1,5-diazabicyclo[4.3.0]-5-nonene or the like. The alkali developer may contain a water-soluble organic solvent such as methanol or ethanol and a surfactant in suitable amounts. The alkali developer is generally washed off with water.

Development is carried out by shower development, spray development, dip development, puddle development or the like at normal temperature for 5 to 300 sec.

The use of the inventive color filter in an electrophoretic display is especially preferred. Further, it is another aspect of the present invention to provide an electrophoretic display device comprising at least one of the inventive color filters.

As described hereinbefore, the photosensitive resist composition is particularly suitable for the manufacture of a color filter in connection with low temperature substrates and/or displays, e.g. electrophoretic displays.

In principle, however, every flexible display, making use of substrates other than glass has a need for a low temperature color filter method. New upcoming techniques that do not need patterning, like inkjet, direct printing etc. also need to cure the coated pixels (solvent removal, hardening etc). For example, inkjet often makes use of radiation curing instead of thermal curing (see, for example, JP 2002-371216). For these techniques, the present photosensitive resist composition also provides strong advantages.

Hence, a preferred embodiment of the present invention relates to methods of printing filter material to fabricate a color filter using the photosensitive resist composition described hereinbefore. It finds particular application in conjunction with printing the red, green, and blue filter material to fabricate a color filter for a display, such as a liquid crystal display (LCD), polymer dispersed LC based displays (PDLC) or monochromic emitting OLED displays.

Accordingly, it is an object to fabricate a color filter for use in a liquid crystal, especially a polymer dispersed liquid crystal based display (PDLC), an organic light emitting diode device (OLED), especially a monochromic emitting OLED display, or similar device by providing a means to successfully use an ink-jet printing system to deposit colored inks in a predetermined position by using a physical barrier to prevent flow of the ink from the designated cell to which it is delivered. Colored inks can be deposited in a very precise manner by an ink-jet process or through a photocopy-like process where either colored thermoplastic or wax is delivered onto the substrate (since the resolution of these devices is greater than the requirements for a color filter). It is ensured that a background is fully saturated with color and that there is a good progression from one color dot to the next to make a smooth transition in color. The colors remain separated and pure, with sharp transitions between each color and the black matrix.

By using a lithographic step or a high resolution printing step to place a raised black mask onto a glass or polymeric sheet, a dam can in effect be formed to contain the ink or toner. The color filter is then "printed" using an inkjet or laser printer mechanism. Using a process such as this, only one lithographic step is required which provides the alignment marks, etc. and also acts to prevent the mixing of colors to ensure a pure color and very clean distinction between colors. It is important that for this process to work effectively, the thickness of the black matrix (mask) must be significantly thicker than is found in current LCD's. A physical barrier can mean any means to prevent the motion of a liquid and can include a dam, a surface wetting phenomena, etc. It is important to note that this invention will be effective for future pixel sizes for LCD's.

Accordingly, the invention relates to the use of the color filter described above in an electrophoretic display (E-paper), a liquid crystal display device, preferably a polymer dispersed liquid crystal based display device, or an organic light emitting diode display device.

In a further aspect, the invention, therefore, relates to a device comprising a color filter as described in any aspect of the invention, which is an electrophoretic display (EPL), a polymer dispersed liquid crystal display (PDLC) or an organic light emitting diode display (OLED).

All definitions and preferences given above for the color filter or photosensitive composition apply equally for the other aspects of the invention.

The use of the inventive photosensitive resist composition leads to an enhanced cross-linking degree of the resulting film during the photo exposure step without the need for a post-baking step after developing. Further, the drying temperature may be lowered to a maximum of 90° C. and even lower, for example 70° C. By combination of the specific copolymer and the highly reactive monomers the cured layers obtained are highly adherent but also more flexible than resist compositions used in the prior art.

The adhesion of said films to substrates, especially glass, SiN coated or plastic substrates, is significantly improved so as to prevent separation or tear in lining. Further, the films are excellent in stability and show excellent chemical and physical resistance against subsequent pigmented resists of the second and third layer. The inventive resist composition forms an accurate and fine pattern.

The use of the selected polyacrylate monomers to achieve a higher cross-linking degree is compatible with the maintenance of physical properties such as superior dispersion stability, solubility and chemical resistance.

Leaving out the post-baking step enables producing a color filter directly on an E-paper display or a plastic substrate, i.e. to use now flexible, temperature sensitive substrates. Further, elimination of the post-baking step reduces the amount of steps, making the manufacturing process cheaper.

Moreover, due to the lowering of the parallax effect, i.e. the distance between the pixels filter and the display is much smaller, the optical quality is significantly improved.

The following examples are provided for the purpose of further illustrating the present invention but are in no way to be taken as limiting. "%" are by weight where not otherwise specified.

EXAMPLES

Synthesis of Polyacrylate Monomers

Example 1

Trimethylolethane Polyglycerolate Polyacrylate 65 g of trimethylolethane triglycidyl ether (0.5 mol of epoxy eq from $^1$H NMR; EEW 130 g, ERISYS GE-31/CVC Chemicals), 0.55 g (5 mmol) of tetramethyl ammonium chloride (1 mol % to epoxy eq) and 100 mg of hydroquinone monomethyl ether are mixed and heated to a temperature of 90° C. 36 g (0.5 mol) of acrylic acid are added dropwise within 30 min keeping the temperature at 90° C. Then, the mixture is stirred at 90° C. until NMR analysis shows complete conversion (9 hours). The mixture is cooled to room temperature to give trimethylolethane polyglycerolate polyacrylate comprising trimethylolethane triglycerolate triacrylate as a viscous, clear, yellow liquid.

$^1$H NMR (500 MHz, CDCl$_3$, δ ppm): 0.92 (t, 3H), 3.32-3.81 (m, 28H), 4.04 (m, 2H), 4.2 (m, 4H), 5.85 (d, 3H), 6.12 (dd, 3H), 6.43 (d, 3H).

Example 2

Pentaerythritol Polyglycerolate Polyacrylate 96 g of pentaerythritol polyglycidyl ether (0.5 mol of epoxy eq from $^1$H NMR; EEW 216, Denacol EX-411/Nagase Chemicals), 0.55 g (5 mmol) of tetramethyl ammonium chloride and 100 mg of hydroquinone monomethyl ether are mixed and heated to a temperature of 90° C. 36 g (0.5 moles) of acrylic acid are added dropwise within 30 min keeping the temperature at 90° C. Then, the mixture is stirred at 90° C. until NMR analysis shows complete conversion (10 hours). The mixture is cooled to room temperature to give pentaerythritol polyglycerolate polyacrylate comprising pentaerythritol tetraglycerolate tetraacrylate as a viscous, clear, yellow liquid.

$^1$H NMR (500 MHz, CDCl$_3$, δ ppm): 3.4-3.8 (m, 58H), 4.0 (s, 4H), 4.2 (m, 6H), 5.86 (d, 4H), 6.14 (dd, 4H), 6.42 (d, 4H).

Synthesis of the Functionalized Polyacrylates

Example 3 a) 112.5 g of methoxypropyl acetate are degassed with nitrogen for 60 min at room temperature followed by heating to 140° C. under a nitrogen atmosphere. A homogenous blend of 60.0 g of benzyl methacylate, 14.3 g of methacrylic acid and 0.38 g of di-t-butylperoxide is added dropwise within 1.5 hours keeping the temperature at 135-140° C. Then, the mixture is stirred for 4 hours at 140° C. and cooled to room temperature. The resulting clear viscous polymer solution has a solid content of 37.7 wt % (halogen dryer, 150° C.). The final polymer solution is adjusted to 25 wt % by addition of 91 g of methoxypropyl acetate. The molecular weight of the polymer is determined by GPC (THF): Mn 5.300, Mw 13.700, pdi 2.6. Viscosity (Brookfield, 20° C., 100 rpm): 438 mPas.

b) Functionalization of the polymer of Example 3a 70 g of the polymer mixture obtained in Example 3a (25 wt % solids) are degassed for 60 min at room temperature followed by heating to 130° C. under a nitrogen atmosphere. During the heating phase, 0.03 g of tetramethyl ammonium chloride and a few crystals (ca 10 mg) of 4-hydroxy-2,2,6,6-tetramethyl piperidine-1-oxyl are added to the polymer mixture. At 130° C., a solution of 1.25 g of glycidyl methacrylate in 2.5 g of methoxypropyl acetate is added dropwise within 45 min keeping the temperature at 130° C. Then, the mixture is stirred for 4 hours at 130° C. and cooled to room temperature. The resulting slightly yellowish polymer solution has a solid content of 24.5 wt % (halogen dryer, 150° C.). Viscosity (Brookfield, 20° C., 100 rpm): 245 mPas.

Example 4 a) 101.6 g of methoxypropyl acetate are degassed with nitrogen for 60 min at room temperature followed by heating to 140° C. under a nitrogen atmosphere. A homogenous blend of 48.4 g of benzyl methacylate, 11.5 g of methacrylic acid and 0.61 g of di-t-butylperoxide is added dropwise within 1.5 hours keeping the temperature at 135-140° C. Then, the mixture is stirred for 4 hours at 140° C. and cooled to room temperature. The resulting clear viscous polymer solution has a solid content of 35.1 wt % (halogen dryer, 150° C.). The final polymer solution is adjusted to 25 wt % by addition of 58 g of methoxypropyl acetate. The molecular weight of the polymer is determined by GPC (THF): Mn 5.300, Mw 12.500, pdi 2.4. Viscosity (Brookfield, 20° C., 100 rpm): 249 mPas.

b) Functionalization of the polymer of Example 4a 84 g of the polymer mixture obtained in Example 4a (25 wt % solids) are degassed with nitrogen for 60 min at room temperature followed by heating to 130° C. under a nitrogen atmosphere. During the heating phase, 0.04 g of tetramethyl ammonium chloride and a few crystals (ca 10 mg) of 4-hydroxy-2,2,6,6-tetramethyl piperidine-1-oxyl are added to the polymer mixture. At 130° C., a solution of 1.50 g of glycidyl methacrylate in 3.0 g of methoxypropyl acetate is added dropwise within 45 min keeping the temperature at 130° C. Then, the mixture is stirred for 4 hours at 130° C. and cooled to room temperature. The resulting slightly yellowish polymer solution has a solid content of 24.1 wt % (halogen dryer, 150° C.). Viscosity (Brookfield, 20° C., 100 rpm): 151 mPas.

APPLICATION EXAMPLES

Color Filters Applications

Example 5

1.5 g of Irgaphor® Red BK-CF (C.I. Pigment Red 254; Ciba), 0.6 g of Ajisper PB 821 (a pigment dispersing agent; Ajinomoto Japan), 7.65 g of propyl glycol monomethyl ether acetate (PGMEA) and 4.0 g of the polymer obtained in Example 3b are mixed under stirring. 30 g of zirconium oxide beads (0.5 mm) are added, and the mixture is shaken in a Skandex for about 15 hours. Then, the dispersion and the beads are separated by sieving.

7.0 g of the resulting dispersion are mixed with 0.35 g of the pentaerythritol polyglycerolate polyacrylate obtained in Example 2 and 3.5 g of PGMEA, followed by adding 0.14 g of Irgacure® OXE02 (a photoinitiator; Ciba). The mixture is shaken for 1 hour.

The mixture is spin coated on a cleaned and dried polyester substrate for 30 sec with 1000 rpm and dried on a hot plate for 2 min at 65° C. The dried film is exposed with UV light through a photo mask (Karl Süss Mirror mask aligner, MA 6) for about 15 sec.

The non-exposed film is washed away with a 0.05% solution of potassium hydroxide in water with 0.25% of a surfactant, rinsed with water and dried on a spin coater for 30 sec at 2000 rpm.

Examples 6 and 7

Example 5 is repeated twice and Irgaphor® Red BK-CF is replaced by a mixture of 1.65 g of Heliogen Green 9365 (C.I. Pigment Green 36, BASF) and 0.85 g of Cromophtal® Yellow LY2 (C.I. Pigment Yellow 150, Ciba) in Example 6 and by 1.44 g of C.I. Pigment Blue 15:6, 0.03 g of Solsperse 5000 and Solsperse 12'000 (two pigment derivatives) in Example 7.

The green layer is aligned on the red substrate of Example 5, and the blue layer is aligned on the red and green layer of Examples 6 and 7, respectively.

Exposure times with the Karl Süss MA 6 mask aligner are 20 sec for the green layer and 50 sec for the blue layer.

Examples 5A to 7A

Examples 5 to 7 are repeated on a glass substrate. The same good results with regard to adhesion are achieved as in Examples 5 to 7. The results of Examples 5A to 7A show a precise formed pixel pattern with a delta structure of three color pixels (R, G and B) with sizes of about 100×150 μm². The distance between the pixels is 10-20 μm.

The result is a well defined three color filter with very good adhesion properties both on polyester and glass substrates.

Comparative Example 8

1.44 g of C.I. Pigment Blue 15.6, 0.03 g of Solsperse 5000 (a pigment derivative), 0.03 g of Solsperse 12'000 (a pigment derivative), 8.3 g of PGMEA and 4.0 g of a generic binder (copolymer of about 20 mol % of methacrylic acid and about 80 mol % of benzyl methacrylate) are mixed under stirring. 30 g of zirconium oxide beads (0.5 mm) are added, and the mixture is shaken in a Skandex for about 15 hours. Then, the dispersion and the beads are separated by sieving.

7.0 g of the resulting dispersion are mixed with 0.83 g of glycerol 1,3-diglycerolate diacrylate (GDDA), 1.22 g of the generic binder and 4.5 g of PGMEA, followed by adding 0.11 g of Irgacure® OXE02 (a photoinitiator). The mixture is shaken for 1 hour. The mixture is spin coated as a single component on glass substrate and on a polyester substrate with a resolution testing mask. Adhesion loss of almost all details can be observed.

Example 9

Example 8 is repeated with the exception that the trimethylolethane polyglycerolate polyacrylate of Example 1 instead of glycerol 1,3-diglycerolate diacrylate and the functionalized polymer obtained in Example 3b instead of the generic binder (copolymer of methacrylic acid and an aromatic methacylate) are used.

The material is applied as a single component material on a glass substrate and a polyester substrate with a resolution testing mask. Adhesion is significantly improved in comparison to the coated material of Comparative Example 8), and even very small details (e.g. digits) are visible.

In order to check the adhesion and undercut during development under very severe conditions, much stronger than normal, a resolution testing mask is used in Comparative Example 8 and Example 9. This mask enables showing specific details of 10 μm going down to 1.5 μm which are much smaller than in a standard pixel design for conventional color filter of 5 to 6 inch (12.7 to 15.24 cm).

The adhesion quality of the layer in Example 9 is significantly improved in comparison to the layer of Comparative Example 8. On the glass substrate of Comparative Example 8 most of the small details are lifted off during the development which can be found elsewhere on the glass substrate.

The same improved result is obtained for a coated polyester substrate of Example 9.

The invention claimed is:

1. A color filter comprising a substrate and a cured layer of a photosensitive resist composition comprising (A) a polyacrylate monomer of formula (I)

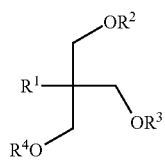

wherein $R^1$ is methyl or $CH_2OR^5$,
$R^2$, $R^3$, $R^4$ and $R^5$ are independently from each other H or a group of formula (II) or (III)

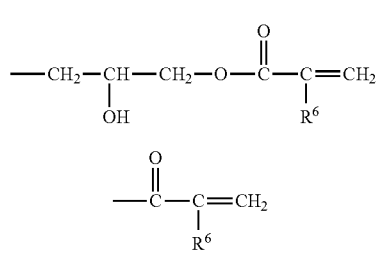

where $R^6$ is independently from each other H or methyl, with the proviso that at least three groups of formula (II) are present;
(B) a binder comprising an alkali soluble copolymer having a side chain containing an ethylenically unsaturated bond, with the proviso that the copolymer does not include a further structural unit containing a branched and/or alicyclic structure in the side chain;
(C) a pigment; and
(D) a photopolymerization initiator,
wherein the copolymer has a structural unit containing an acidic group and a structural unit of formula (IVa), and, optionally, (IVb) or (IVc):

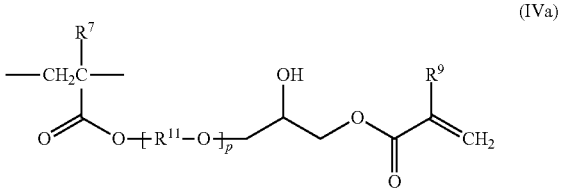

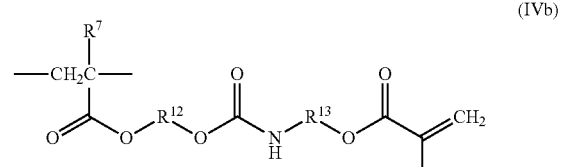

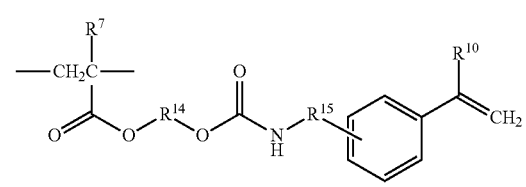

wherein
$R^7$, $R^9$ and $R^{10}$ are independently from each other H or methyl,
$R^{11}$, $R^{12}$, $R^{13}$, $R^{14}$ and $R^{15}$ are independently from each other $C_1$-C6 alkylene or phenylene; and
p is 0, 1, 2, or 3,
wherein the copolymer is obtainable by polymerizing
(a) (meth)acrylic acid, and
(b) at least one monomer selected from the group consisting of methyl (meth)acrylate, n-butyl (meth)acrylate, styrene, 2-hydroxyethyl (meth)acrylate and benzyl (meth)acrylate,
in a molar ratio of (a) to (b) of from 1:4 to 1:1;
followed by functionalizing the acidic group of (a) to form at least one unit of formula (IVa):

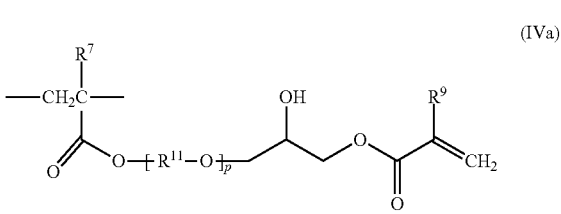

wherein p is 0 and the molar ratio of (a) to (IVa) in the final copolymer is from 9:1 to 3:1.

2. The color filter according to 1, wherein the copolymer comprises at least one monomer unit selected from the group consisting of styrene, methyl (meth)acrylate, ethyl (meth)acrylate, n-butyl (meth)acrylate, 2-hydroxyethyl (meth)acrylate, allyl (meth)acrylate, benzyl (meth)acrylate, phenyl (meth)acrylate, glycerol mono(meth)acrylate, N-phenylmaleimide, polystyrene macromonomer and polymethyl (meth)acrylate macromonomer.

3. The color filter according to claim 1, wherein the copolymer has a molar ratio of the structural unit containing an acidic group to the structural unit of formula (IV) of from 9:1 to 3:1.

4. The color filter according to claim 1, wherein the polyacrylate monomer is trimethylolethane triglycerolate tri(meth)acrylate or pentaerythritol tetraglycerolate tetra(meth)acrylate.

5. The color filter according to claim 1, wherein the pigment (C) is selected from the group consisting of an organic pigment and carbon black.

6. The color filter according to claim 1, wherein the photosensitive resist composition comprises the binder (B) in an amount of 10 to 1,000 parts by weight, based on 100 parts by weight of the pigment (C), the polyacrylate monomer (A) in an amount of 5 to 500 parts by weight, based on 100 parts by weight of the binder (B), and the photopolymerization initiator (D) in an amount of 0.01 to 200 parts by weight, based on 100 parts by weight of the total of the polyacrylate monomer (A).

7. The color filter according to claim 1, wherein the content of the pigment in the layer is 0.02 to 1.5 $g/m^2$.

8. The color filter according to claim 1, wherein the substrate is a temperature sensitive substrate comprising a display device selected from an electrophoretic display, a polymer dispersed liquid crystal display and an organic light emitting diode display.

9. A process for producing a color filter, which process comprises the steps of coating the photosensitive resist composition as defined in claim 1 on a substrate, drying, exposing and developing to form a film.

10. The process according to claim 9, which process further comprises a step of drying the developed film at a temperature of from 20 to 70° C.

11. A device comprising a color filter according to claim 1, which is an electrophoretic display, a polymer dispersed liquid crystal display or an organic light emitting diode display.

12. The color filter according to claim 1, wherein the copolymer has a structural unit of formula (IVb).

13. The color filter according to claim 1, wherein the copolymer has a structural unit of formula (IVc).

14. The color filter according to claim 1, wherein the copolymer has a structural unit of formula (IVb) and (IVc).

* * * * *